(12) United States Patent
Clark et al.

(10) Patent No.: US 6,943,484 B2
(45) Date of Patent: Sep. 13, 2005

(54) TUNABLE PIEZOELECTRIC MICRO-MECHANICAL RESONATOR

(75) Inventors: William W. Clark, Wexford, PA (US); Qing-Ming Wang, Wexford, PA (US)

(73) Assignee: University of Pittsburgh, Pittsburgh, PA (US)

( * ) Notice: Subject to any disclaimer, the term of this patent is extended or adjusted under 35 U.S.C. 154(b) by 226 days.

(21) Appl. No.: 10/313,874

(22) Filed: Dec. 6, 2002

(65) Prior Publication Data

US 2003/0127944 A1 Jul. 10, 2003

Related U.S. Application Data

(60) Provisional application No. 60/337,075, filed on Dec. 6, 2001.

(51) Int. Cl.[7] .............................................. H01L 41/08
(52) U.S. Cl. ................... 310/334; 310/316.01; 310/366
(58) Field of Search ................................ 310/321, 322, 310/320, 334, 366, 316.01, 317, 319

(56) References Cited

U.S. PATENT DOCUMENTS

| | | | | | |
|---|---|---|---|---|---|
| 3,576,453 | A | * | 4/1971 | Mason ........................ | 310/320 |
| 3,599,124 | A | * | 8/1971 | Smith et al. ................... | 333/32 |
| 3,614,483 | A | * | 10/1971 | Berlincourt .................. | 310/321 |
| 3,732,510 | A | * | 5/1973 | Mason ........................ | 333/191 |
| 4,376,919 | A | * | 3/1983 | Konno et al. ................ | 331/158 |
| 5,132,643 | A | * | 7/1992 | Ueno et al. .................. | 331/163 |
| 5,153,476 | A | * | 10/1992 | Kosinski .................. | 310/313 R |
| 5,361,045 | A | | 11/1994 | Beaussier et al. | |
| 5,783,973 | A | | 7/1998 | Weinberg et al. | |
| 6,720,709 | B2 | * | 4/2004 | Porat et al. .................. | 310/324 |

OTHER PUBLICATIONS

Orlov et al., Use of Active Networks to Widen the Spectrum of Application of Piezoelectric Filters; 1994 IEEE International Frequency Control Symposium; 0–7803–1945–1/94; 1994 IEEE.

Park et al., Capacitive type surface–micromachined silicon accelerometer with stiffness tuning capability; Sensors and Actuators 73 (1999) 109–116; 0924–4247/99; 1999 Elsevier Science S.A.

Smythe et al., Adjustment of Resonator G–Sensitivity by Circuit Means; Forty–Fourth Annual Symposium on Frequency Control; IEEE Catalog No. 90CH2818–3; Library of Congress No. 87–654207; May 23–25, 1990.

(Continued)

*Primary Examiner*—Mark Budd
(74) *Attorney, Agent, or Firm*—Thorp Reed & Armstrong, LLP

(57) ABSTRACT

One aspect of the invention relates to a composite member for a resonator having an active piezoelectric element and a passive piezoelectric element. The active piezoelectric element causes the resonator to vibrate and detects the frequency of the vibration. The passive piezoelectric element changes the frequency of the vibration. Another aspect of the invention relates to a method for controlling a resonator with composite member having a substrate carrying a composite piezoelectric element. The composite piezoelectric element includes an actuator element, a sensor element and a passive element. The method comprises inducing a resonance within the composite member with the actuator element, detecting the resonance with the sensor element, and altering the resonance by altering the electromechanical coupling of the passive element. Additional aspects and benefits of the invention are also given.

51 Claims, 6 Drawing Sheets

OTHER PUBLICATIONS

Adams, et al., Capacitance Based Tunable Micromechanical Resonators, 1995, Cornell University, Ithaca, NY, 14853; Dept. of Theoretical and Applied Mechanics; School of Electrical Engineering: School of Mechanical and Aerospace Engineering.

Bochobza–Degani, et al., A novel micromachined vibrating rate–gyroscope with optical sensing and electrostatic actuation, Sensors and Actuators 83 (2000) 54–60, Elsevier Science S.A.

Boltshauser, et al., Resonant humidity sensors using industrial CMOS–technology combined with postprocessing, 205–207, 1992 IOP Publishing Ltd.

Brand, et al., Thermally excited silicon oxide bridge resonators in CMOS technology, J. Micromech, Microeng. 2 (1992) 208–210, 1992 IOP Publishing Ltd.

Burrer, et al., A novel resonant silicon accelerometer in bulk–micromaching technology, Sensors and Actuators A 46–47 (1995) 185–189, Elsevier Science S.A.

Cleland, et al., External control of dissipation in a nanometer–scale radiofrequency mechanical resonator, Sensors and Actuators 72 (1999) 256–261, Elsevier Science S.A.

Cretu, et al., Spectral analysis through electromechanical coupling, Sensors and Actuators 85 (2000) 23–32, Elsevier Science S.A.

Dulmet, et al., Frequency–output force sensor using a multimode doubly rotated quartz resonator, Sensors and Actuators A 48 (1995) 109–116, Elsevier Science S.A.

Enoksson, et al., Fluid density sensor based on resonance vibration, Sensors and Actuators A 46–47 (1995) 327–331, Elsevier Science S.A.

Greywall, Micromechanical RF filters excited by the Lorentz force, J. Micromech. Microeng. 9 (1999) 78–84, IOP Publishing Ltd.

Hashimoto, et al., Silicon resonant angular rate sensor using electromegnetic excitation and capacitive detection, J. Micromech. Microeng. 5 (1995) 219–225, IOP Publishing Ltd.

Harb, et al., Resonator–based touch–sensitive probe, Sensors and Actuators A 50 (1995) 23–29, Elsevier Science S.A.

Haronian, et al., A microelectromechanics–based frequency–signature sensor, Sensors and Actuators A 53 (1996) 288–298, Elsevier Science S.A.

Hong, et al., A laterally driven symmetric micro–resonator for gyroscopic applications, J. Micromech. Microeng. 10 (2000) 452–458, IOP Publishing Ltd.

Kim, et al., A micromachined cavity resonator for millimeter–wave oscillator applications, Sensors and Actuators 83 (2000) 1–5, Elsevier Science S.A.

Lee, et al., Cantilever with integrated resonator for application of scanning probe microscope, Sensors and Actuators 83 (2000) 11–16, Elsevier Science S.A.

Melin, et al., A low–pressure encapsulated deep reactive ion etched resonant pressure sensor electrically excited and detected using 'burst' technology, J. Micromech. Microeng. 10 (2000) 209–217, IOP Publishing Ltd.

Mihailovich, et al., Dissipation measurements of vacuum–operated single crystal silicon microresonators, Sensors and Actuators A 50 (1995) 199–207, Elsevier Science S.A.

Stemme, Resonant silicon sensors, J. Micromech. Microeng. 1 (1991) 113–125, IOP Publishing Ltd.

Tilmans, et al., A novel design of a highly sensitive low differential–pressure sensor using built–in resonant strain gauges, 198–202, 1993 IOP Publishing Ltd.

Welham, et al., A laterally driven micromachined resonant pressure sensor, Sensors and Actuators A 52 (1996) 86–91, Elsevier Science S.A.

Zook, et al., Optically excited self–resonant microbeams, Sensors and Actuators A 52 (1996) 92–98, Elsevier Science S.A.

* cited by examiner

TUNABLE PIEZOELECTRIC MICRO-MECHANICAL RESONATOR

This application claims the priority benefit of U.S. provisional application Ser. No. 60/337,075, filed on Dec. 6, 2001, entitled "Tunable Piezoelectric Micro-Mechanical Resonator," which is incorporated hereby in its entirety by reference.

BACKGROUND

1. Field of the Invention

The present invention relates generally to frequency generating devices for electrical circuits and more particularly to a piezoelectric micro-mechanical resonator that can be tuned to a specific frequency and switched between differing frequencies.

2. Description of the Related Art

Conventional oscillator design typically falls into one of two categories: quartz crystal controlled oscillators and non-crystal oscillators. The current standard for high precision frequency generation in electronic circuits is the quartz crystal oscillator. Quartz oscillators are desirable because they resist variations due to aging and temperature (among others), and because they typically possess extremely high quality factors. Quality factor (denoted as "Q-factor", or simply "Q") generally refers to a measure of an oscillator's resonance "sharpness." Q is roughly defined as the ratio of height to width of the oscillator's resonant peak.

Typical quartz oscillators, however, cannot achieve the miniaturization levels desired by integrated circuit designers. Due to their size, quartz oscillators are constructed "off-chip" (i.e., separate from the integrated circuit that is being controlled). Additionally, quartz oscillators possess a limited frequency range and thus are not suitable for switching from one frequency to another (i.e., "frequency hopping"). Quartz oscillators also require large amounts of power to operate relative to other integrated circuit components.

An increased desire for integration, miniaturization, and power reduction has lead to a search for non-crystal oscillators that can be integrated "on-chip" and operated with the same power supplies as the circuitry that is being controlled. Non-crystal oscillators (which may be electrical circuits such as inductor-capacitor circuits and ring oscillators, among others) offer the ability to integrate the frequency source on-chip, with the accompanying advantages over multi-component quartz-based systems in size, power, frequency range and robustness to signal corruption through integration. Non-crystal oscillators, however, typically possess low Q-factors. For example, typical non-crystal oscillators have Q-factors on the order of tens, as compared to typical quartz oscillators whose Q factors are on the order of thousands. Thus, any circuit that is built with a non-crystal, on-chip frequency generator inherently possesses severely limited frequency precision and resolution.

One family of non-crystal oscillators utilize micro-mechanical resonators. Micro mechanical system technology and fabrication has given rise to many designs and applications of micro-mechanical resonators. In general, there are three types of basic micro-mechanical resonators: lumped-parameter (discrete spring-mass systems), flexural (beams, plates, and diaphragms) and acoustic wave (bulk and surface acoustic wave). Each of these resonators is used in a variety of applications such as sensors, oscillators, electromechanical filters, frequency references, high-speed signal processing, high-speed wireless communication systems, collision avoidance radar, intelligent transportation systems, scanned probe microscopy, touch sensitive probes, charge detection, gyroscopes, acoustic transducers and spectral analysis, among others.

Because resonant sensors themselves span such a variety of applications, further description is desirable. Typical micro-mechanical resonant sensors may be used in proximity sensors, strain gauges, pressure sensors, accelerometers, angular rate sensors, humidity sensors, fluid density sensors, and force sensors, among others. The resonant sensor's frequency output can be easily measured with digital electronics that result in high resolution results. Resonant sensors provide a compact, low cost, and more accurate substitution to their macro-sized counterparts.

In each of the above-mentioned applications, there is a desired frequency of operation, sometimes referred to as the "nominal frequency", for the resonator. Thus in general, the above-mentioned resonators must have a "tuning" capability to achieve the desired resonance frequency. Tuning is used to compensate for effects caused by fabrication tolerances, residual manufacturing stresses, material defects, temperature effects, non-homogeneous material properties, material aging, thermal mismatch, contamination, and environmental factors, among others.

A need therefore exists for a resonator that has a higher Q factor than that offered by other electrical resonators, and which, unlike quartz resonators, can be fabricated on-chip to enable miniaturization, integration, and reduced power consumption. Additionally, a need exists for an improved resonator and a method of tuning or rapidly switching the frequency of the resonator which overcomes the limitations of quartz and non-crystal resonators and other limitations inherent in prior art resonators.

SUMMARY

One aspect of the present invention relates to a composite member for a resonator comprising an active piezoelectric element for causing the resonator to vibrate and for detecting the frequency of the vibration, and a passive piezoelectric element operable to change the frequency of the vibration.

Another aspect of the present invention relates to a piezoelectric resonator comprising a substrate, a first electrode carried by the substrate, and a composite piezoelectric element carried by the first electrode. The composite piezoelectric element may include an actuator element, a sensor element, and a passive element. The piezoelectric resonator also is comprised of a second electrode carried by the composite piezoelectric element, an excitation circuit operable to supply a control signal to the actuator element and operable to receive a feedback signal from the sensor element, and a tuning circuit operable to alter the electromechanical coupling of the passive element.

Additionally, one aspect of the present invention relates to a tunable piezoelectric micro-mechanical resonator comprising a composite member comprised of a piezoelectric actuator element, a piezoelectric sensor element, a piezoelectric passive element, and a substrate carrying the piezoelectric actuator element, the piezoelectric sensor element and the piezoelectric passive element. The tunable piezoelectric micro-mechanical resonator is also comprised of an excitation circuit operable to induce a resonance at a frequency within the composite member and operable to receive a feedback signal from the composite member, and a tuning circuit connected to the piezoelectric passive element and operable to vary the frequency.

Another aspect of the present invention relates to a method for controlling a resonator having composite member, the composite member having a substrate carrying a composite piezoelectric element, wherein the composite piezoelectric element includes an actuator element, a sensor element and a passive element. The method comprises inducing a resonance within the composite member with the actuator element, detecting the resonance with the sensor element, and altering the resonance by altering the electromechanical coupling of the passive element.

Another aspect of the present invention relates to a method for tuning a resonator operating at one of a plurality of frequency modes, the resonator being comprised of a composite member having a substrate carrying a piezoelectric element, the piezoelectric element including an actuator element, a sensor element and a passive element. The method comprises inducing a vibration at a single frequency within the composite member with the actuator element, detecting the frequency with the sensor element, and adjusting the frequency with the passive element.

Those advantages and benefits, and others, will be apparent from the Detailed Description below.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

The present invention utilizes active and passive piezoelectric elements to provide a tunable micro-mechanical resonator. Piezoelectric materials have long been used as transducer elements in sensors and actuators in electromechanical systems. As is well known in the art, a piezoelectric material refers to a material that, when subjected to a mechanical pressure, produces an electrical signal, and when subjected to an electric field, produces a change in the dimensions of the material.

It should be noted that in the following description "frequency tuning" refers to zeroing in on a specific frequency, whereas "frequency switching" or "frequency hopping" refers to changing from one frequency to another. For example, the piezoelectric micro-mechanical resonator 10 of the present invention may switch between frequencies spanning several percent of the nominal frequency of the resonator. Although this distinction is made for clarity, it should be noted that the present invention is applicable to both frequency tuning and frequency hopping applications.

Figure 1:
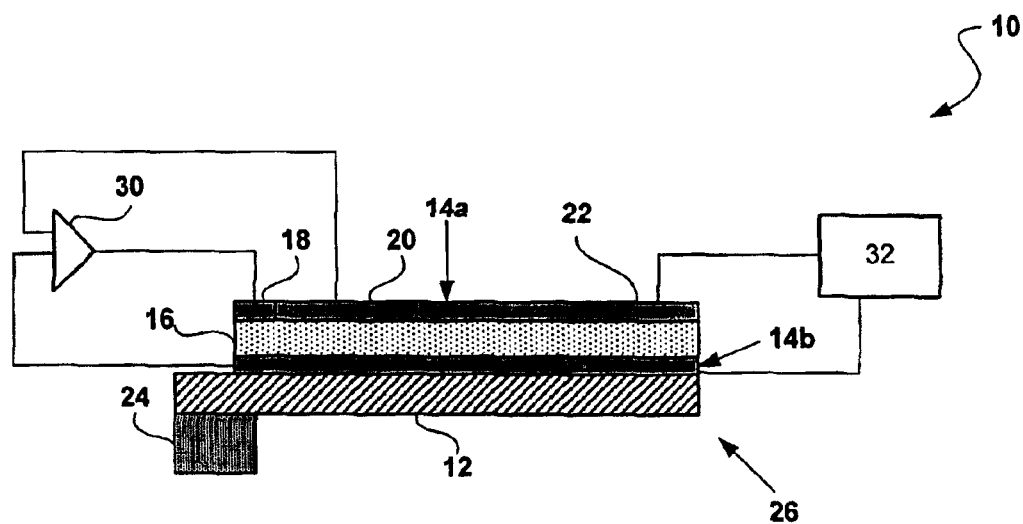
FIG. 1 is a simplified side view of a piezoelectric micro-mechanical resonator according to one embodiment of the present invention.
Figure 2:
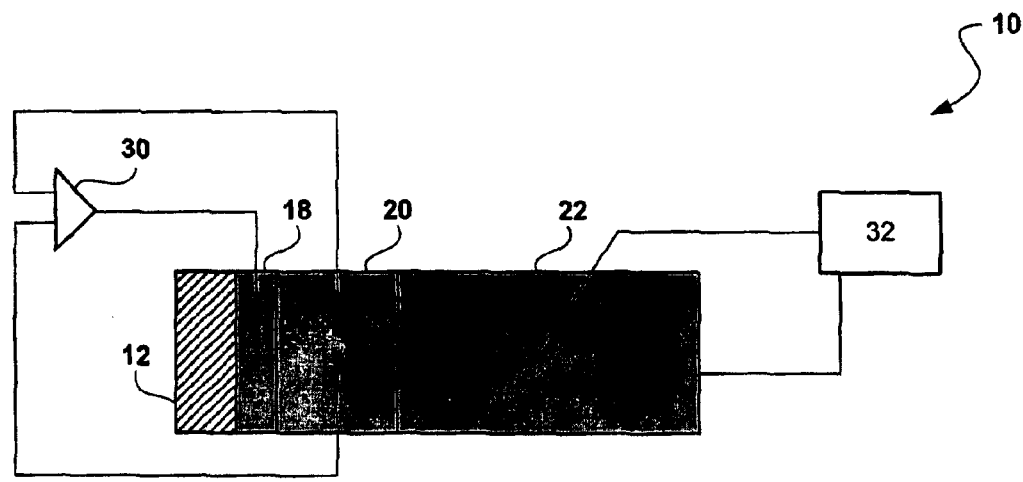
FIG. 2 is a simplified top view of the piezoelectric micro-mechanical resonator of FIG. 1 according to one embodiment of the present invention.

FIGS. 1 and 2 are simplified side and top views, respectively, of a piezoelectric micro-mechanical resonator 10 according to one embodiment of the present invention. The piezoelectric micro-mechanical resonator 10 is comprised of a substrate 12, electrodes 14a, 14b, and a piezoelectric element 16, among others. In the current embodiment, the piezoelectric micro-mechanical resonator 10 is constructed in a cantilevered beam arrangement in which the proximal end of the substrate 12 is clamped to a fixed surface 24 (for example, a portion of an IC-chip); whereas the distal end of the substrate 12 is unclamped. The substrate 12 carries the electrodes 14a, 14b and the piezoelectric element 16. In such an arrangement, the substrate 12, electrodes 14a, 14b and piezoelectric element 16 may be referred to as a single, composite member 26.

The substrate 12 may be selected to provide tensile strength to the piezoelectric element 16, increase the total Q-factor of the resonator 10, and to facilitate the fabrication technique selected to construct the resonator, among others. In the current embodiment, the substrate 12 is comprised of a non-piezoelectric material and has at least two functions: 1) it provides tensile strength to the piezoelectric element 16, which is generally brittle and 2) it has a high quality factor to improve the resonant characteristics of the resonator 10. It should be noted that the material selected for the substrate 12 may be varied while remaining within the scope of the present invention.

In the current embodiment, the piezoelectric element 16 is comprised of a continuous piece of piezoelectric material. The piezoelectric element 16 is "virtually segmented" into three portions, an actuator element, a sensor element, and a passive element. The segments are defined by separate electrodes for the actuator element, the sensor element, and the passive element. For example, electrode 14a is comprised of an actuator electrode 18, a sensor electrode 20, and a passive electrode 22. In the current embodiment, the portion of the piezoelectric element 16 that actuates the piezoelectric micro-mechanical resonator 10 when electrically stressed by a signal applied via actuator electrode 18 is referred to as the actuator element. The portion of the piezoelectric element 16 that produces a signal proportional to the amount of mechanical stress applied to the piezoelectric element 16, the signal being detected by sensor electrode 20, is referred to as the sensor element. The portion of the piezoelectric element 16 that is coupled to a tuning circuit 32 via passive electrode 22 is referred to as the passive element.

It should be noted that a non-continuous piezoelectric element 16 may be used while remaining within the scope of the present invention. For example, separate actuator, sensor, and passive elements may be carried on the substrate, among others. Separate actuator 18 and sensor 20 electrodes, or a combination actuator/sensor electrode, may also be used (among others), while also remaining within the scope of the present invention. Additionally, the actuator element and the sensor element may be referred to as the active piezoelectric element. It should further be noted that electrode 14*b*, as shown, is common to the actuator, sensor, and passive elements, however other configurations may be used while remaining within the scope of the present invention. For example, the actuator element may be defined by an actuator electrode and a first electrode, the sensor element may be defined by a sensor electrode and a second electrode, and the passive element may be defined by a passive electrode and a third electrode.

In the current embodiment, the sensor and actuator elements are used in conjunction with an excitation circuit. The excitation circuit causes the composite member 26 to vibrate at a resonant frequency. The excitation circuit includes a feedback loop having an amplifier 30.

In the current embodiment, the composite member 26 undergoes flexural vibration when a control signal (i.e., from the excitation circuit) is applied via the actuator electrode 18 to the actuator element. As the composite member 26 vibrates, the sensor element generates a charge in proportion to its mechanical strain. A generated frequency signal may be detected, for example, through measurement of the generated charge or voltage present at the sensor electrode 20. The generated frequency signal is fed back to the excitation circuit via the feedback loop. Thus, the control signal includes a feedback component from the sensor element. The control signal, when applied to the actuator element, causes the piezoelectric micro-mechanical resonator 10 to vibrate at one of its mechanical resonances, thereby generating a well-defined frequency.

It should be noted that resonator 10 may be made to oscillate at the frequency of any one of a large number of its different modes. For example, altering the actuator element and sensor element geometries and locations on the structure, and altering the feedback loop's gain, phase and bandwidth, among others, may be used to cause the resonator to oscillate at the frequency of any one of a large number of its different modes.

The mechanical resonance frequency of the piezoelectric micro-mechanical resonator 10 may be changed by altering the electromechanical coupling of the passive element by way of tuning circuit 32. For example, the electromechanical coupling of the passive element can be altered by electrically shunting a capacitance across the passive element 22. In the current embodiment, the tuning circuit is used in conjunction with the passive electrode 22 and electrode 14*b* to shunt a capacitance across the passive element.

The passive element, being part of the piezoelectric element 16, undergoes strain as the resonator 10 vibrates. The effective mechanical stiffness of the passive element may be adjusted by altering the electromechanical coupling experienced by the passive element. Altering the passive element's effective mechanical stiffness changes the composite member's 26 total structural stiffness, thus changing the resonator's 10 frequency.

It should be noted that the mechanical frequency of the resonator 10 may be defined in simplified terms as $\omega_n = \sqrt{k/m}$ where k is the structural stiffness and m is the mass of the resonator. In the current embodiment, a tuning circuit 32 is used to alter the electromechanical coupling of the passive element for changing a portion of k, thereby changing $\omega_n$.

The tuning circuit 32 may include shunt capacitors and switching circuitry for adjusting the shunt capacitance to tune or switch the resonator's 10 frequency. The tuning circuit 32 may also include a varactor to enable continuous tuning or switching. It should be noted that the tuning circuit may be used for both tuning and frequency hopping applications.

The tunable piezoelectric micro-mechanical resonator 10 may be constructed using micro-scale (MEMS) devices that incorporate the basic components described above. It should be apparent to those skilled in the art that other methods of construction may also be used while remaining within the scope of the present invention. It should also be noted that many different variations of tunable resonators may be used while remaining within the scope of the present invention. For example referring to FIGS. 10(*a*)–10(*d*), resonators may be constructed which do not utilize the cantilevered beam arrangement. FIG. 10(*a*) illustrates a clamped—clamped beam piezoelectric resonator, FIG. 10(*b*) illustrates an axial rod piezoelectric resonator, FIG. 10(*c*) illustrates a shear layer piezoelectric resonator, and FIG. 10(*d*) illustrates a diaphragm piezoelectric resonator. It should be noted that FIGS. 10(*a*)–10(*d*) are for illustrative purposes only and other arrangements may be used while remaining within the scope of the present invention. For example, the piezoelectric micro-mechanical resonator 10 of the present invention may be used in any of the applications described in the background of the invention, among others.

It should also be apparent to one skilled in the art that the materials used for the piezoelectric micro-mechanical resonator 10 may be varied depending upon design, process, and manufacturing characteristics (among others) that are to be achieved while remaining within the scope of the present invention. For example, the piezoelectric material may be comprised of lead zirconate titanate, zinc oxide, lithium niobate, lithium tantalate, quartz, aluminum nitride, and polyvinylidine diflouride, among others.

Figure 3:
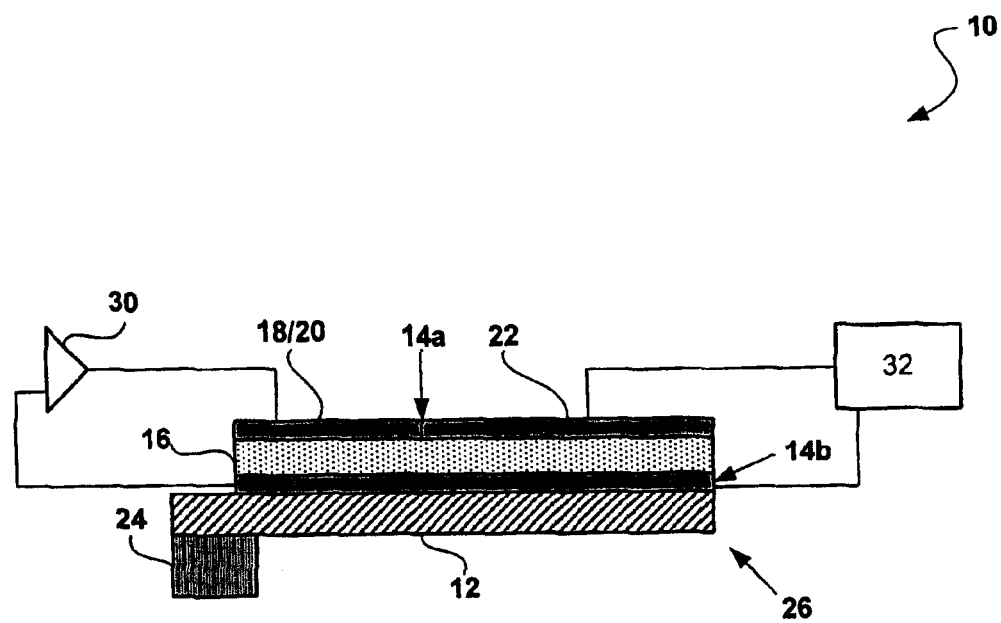
FIG. 3 is a simplified side view of a piezoelectric micro-mechanical resonator according to another embodiment of the present invention.
Figure 4:
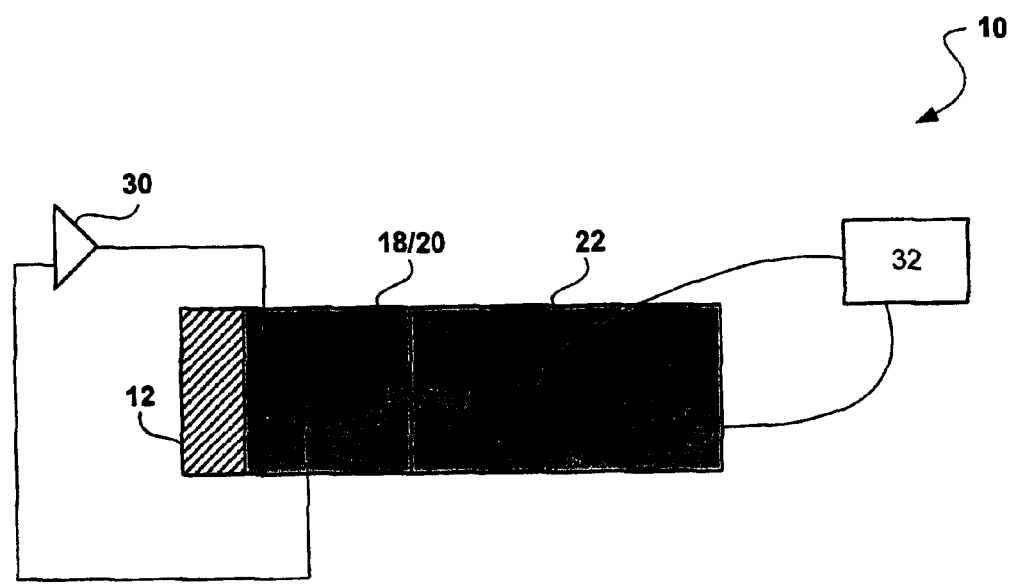
FIG. 4 is a simplified top view of the piezoelectric micro-mechanical resonator of FIG. 3 according to an embodiment of the present invention.

FIGS. 3 and 4 are simplified side and top views, respectively, of a piezoelectric micro-mechanical resonator 10 according to another embodiment of the present invention. As best illustrated by FIG. 3, an alternative feedback loop arrangement is shown. More specifically, distinct actuator 18 and sensor 20 electrodes (and thus distinct actuator and sensor elements) are not used, but rather the actuator electrode 18 and sensor electrode 20 are combined into a single active portion of the resonator 10 that is in the feedback path of the amplifier 30. The remaining portion of piezoelectric element 16 (i.e., the passive element) is used for frequency tuning the piezoelectric micro-mechanical resonator 10 as discussed in conjunction with FIGS. 1 and 2.

Figure 5:
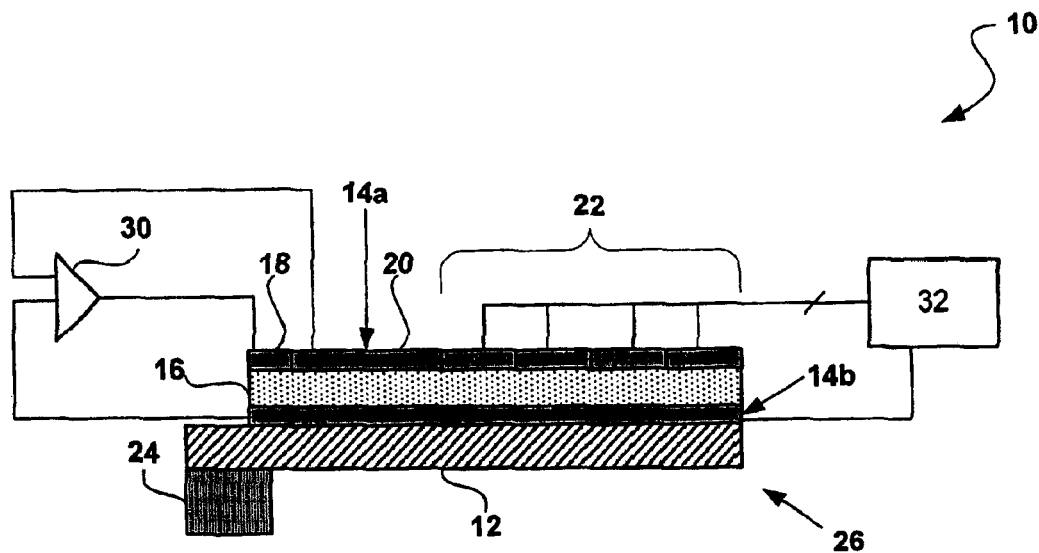
FIG. 5 is a simplified side view of a piezoelectric micro-mechanical resonator according to another embodiment of the present invention.
Figure 6:
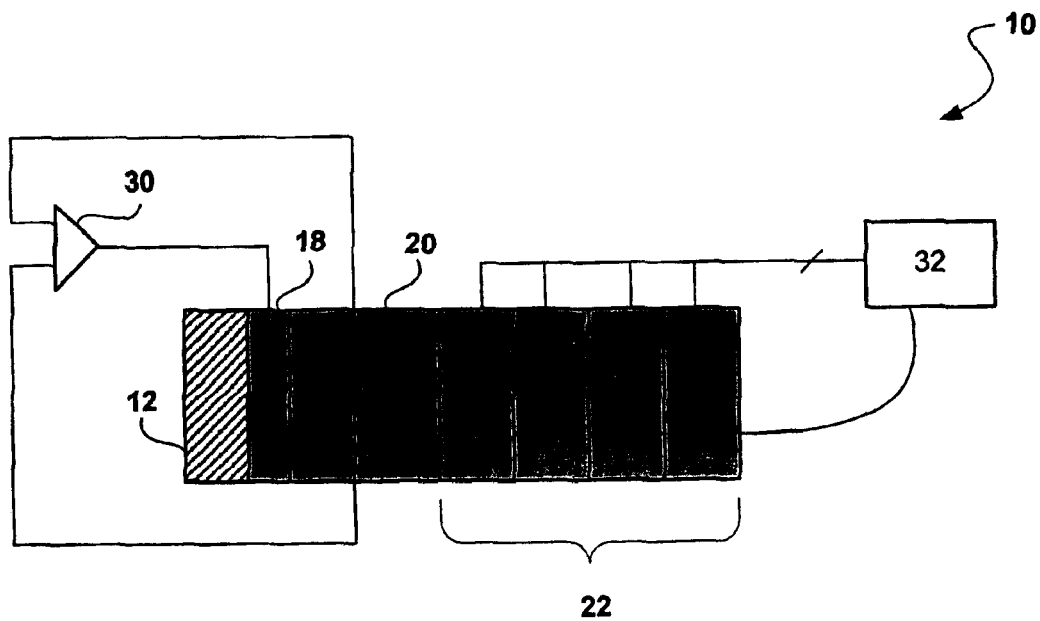
FIG. 6 is a simplified top view of the piezoelectric micro-mechanical resonator of FIG. 5 according to an embodiment of the present invention.

FIGS. 5 and 6 are simplified side and top views, respectively, of a piezoelectric micro-mechanical resonator 10 according to yet another embodiment of the present invention. As best illustrated by FIG. 5, a virtually segmented passive electrode 22 is shown. As discussed above in conjunction with FIG. 1, the piezoelectric element 16 is a continuous piezoelectric material. The piezoelectric element 16 is virtually "segmented" into actuator, sensor, and passive elements by the actuator, sensor, and passive electrodes, respectively. Likewise, a segmented passive electrode 22 virtually "segments" the passive element of the piezoelectric element 16. Thus, the electromechanical coupling experienced by each virtual segment of the passive element can be altered. For example, each virtual segment of the passive element may have an independent shunt placed across it, thus permitting a more precise degree of tuning or eliminating the need for shunt capacitors.

Figure 7:
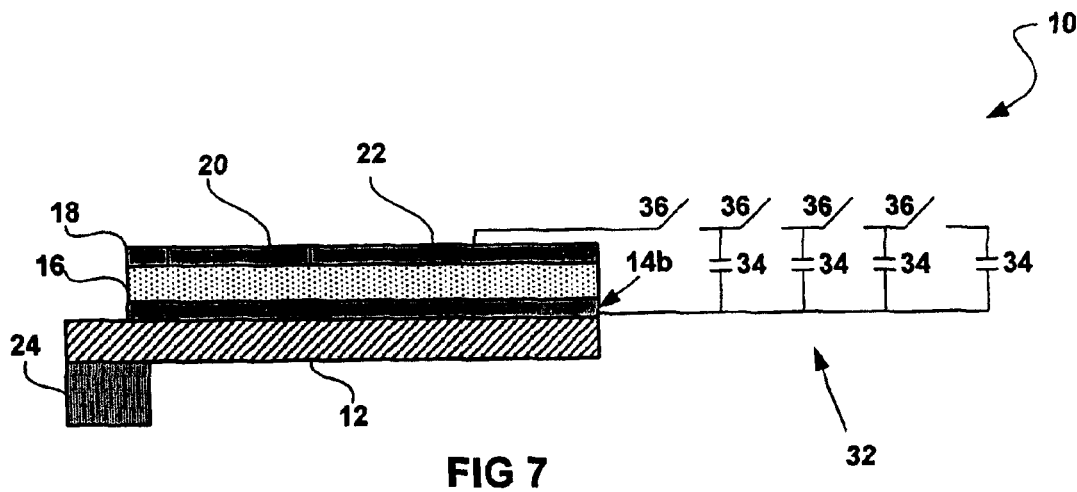
FIG. 7 is a schematic view illustrating a tuning circuit for the piezoelectric micro-mechanical resonator illustrated in FIG. 1 according to one embodiment of the present invention.

FIG. 7 is a schematic view illustrating a tuning circuit 32 for the piezoelectric micro-mechanical resonator 10 illustrated in FIG. 1 according to one embodiment of the present invention. The tuning circuit 32 is operable for tuning and frequency hopping applications. As illustrated in FIG. 7, a multitude of capacitors 34 may be shunted across the passive element via passive electrode 22 and electrode 14b. The capacitors 34 may be connected to and disconnected from the passive electrode 22 and electrode 14b by a multitude of switches 36. The resonant frequency of the piezoelectric micro-mechanical resonator 10 is altered by controlling the amount capacitance shunting the passive element.

The simplified governing equation for a single vibration mode of the piezoelectric micro-mechanical resonator 10 shown in FIG. 1 is given as follows:

$$ms^2Y(s)+kY(s)=F(s) \tag{1}$$

where m and k are the equivalent mass and stiffness of the vibration mode, respectively; Y is the generalized displacement of the resonator; F is the generalized force applied to excite the resonator 10 by the actuator element; and s is the Laplace operator. The natural vibration frequency of the vibration mode shown in equation 1 is $\omega_n = \sqrt{k/m}$.

In general terms, the equivalent stiffness can be written as a collection of compliances of individual parts of the composite resonator as:

$$k=(c_{substrate}+c_{actuator}+c_{sensor}+c_{passive})^{-1} \tag{2}$$

The compliance of the passive portion of the piezoelectric material can further be written as:

$$c_{passive}=(c_{mechanical}-c_{electromechanical})^{-1} \tag{3}$$

indicating that its resistance to strain is a combination of mechanical and electromechanical contributions. The electromechanical part of the compliance can be written as $$c_{electromechanical} = \alpha\left(\frac{1}{C_{piezo}} + \frac{1}{C_{shunt}}\right)^{-1} \tag{4}$$

where $C_{piezo}$ is the equivalent capacitance of the passive piezoelectric material, $C_{shunt}$ is the capacitance of a shunt circuit applied between the electrodes 22, 14b of the passive piezoelectric material, and $\alpha$ is a constant that depends on the embodiment of the resonator.

It is clear from equations 2–4 that by altering the shunt capacitance, $C_{shunt}$, the equivalent stiffness can be altered, and therefore the natural vibration frequency of that mode of the resonator can be changed. The extremes of adjustment are:

Short Circuit Shunt:

$$C_{shunt}=0 \rightarrow c_{electromechanical}=0, \tag{5}$$

which causes the equivalent stiffness, and thus the natural frequency, to be at its minimum possible value;

Open Circuit Shunt $$C_{shunt} = \infty \Rightarrow c_{electromechanical} = \alpha\left(\frac{1}{C_{piezo}}\right)^{-1}, \tag{6}$$

which causes the equivalent stiffness, and thus the natural frequency, to be at its maximum possible value. Intermediate values of equivalent stiffness, and thus natural frequency, can be obtained with an arbitrary shunt capacitance between 0 and $\infty$.

Thus, examining equations 1–6 it is evident that the maximum effective compliance (minimum stiffness) of the piezoelectric element 16 is obtained in short-circuit conditions; the minimum effective compliance (maximum stiffness) of the piezoelectric element 16 is obtained in open-circuit conditions; and the effective compliance (and stiffness) can be varied between short- and open-circuit values by inserting a shunt capacitance.

Figure 8:
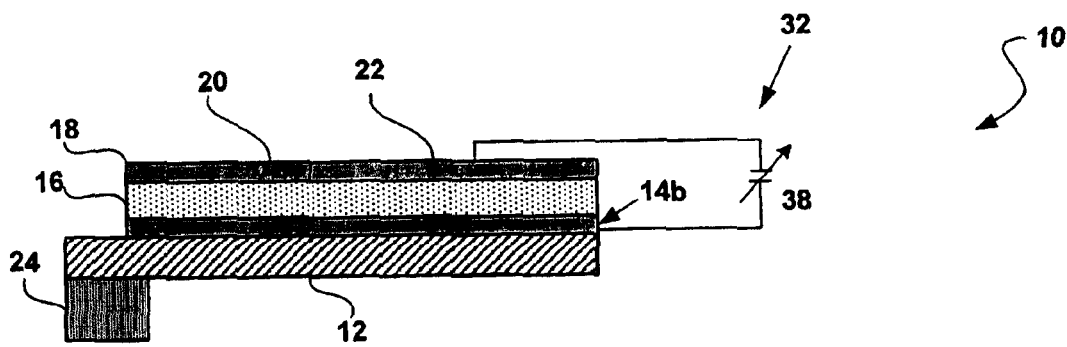
FIG. 8 is a schematic view illustrating a tuning circuit for the piezoelectric micro-mechanical resonator illustrated in FIG. 1 according to another embodiment of the present invention.

FIG. 8 is a schematic view illustrating an alternative tuning circuit 32 for the piezoelectric micro-mechanical resonator 10 illustrated in FIG. 1 according to one embodiment of the present invention. As illustrated in FIG. 8, the passive element is shunted by a capacitor 38, such as a varactor, among others. The capacitor 38 is connected to the passive element via passive electrode 22 and electrode 14b. The resonant frequency of the piezoelectric micromechanical resonator 10 can be altered by controlling the varactor 38 and adjusting the amount of capacitance which shunts the passive element.

Figure 9:
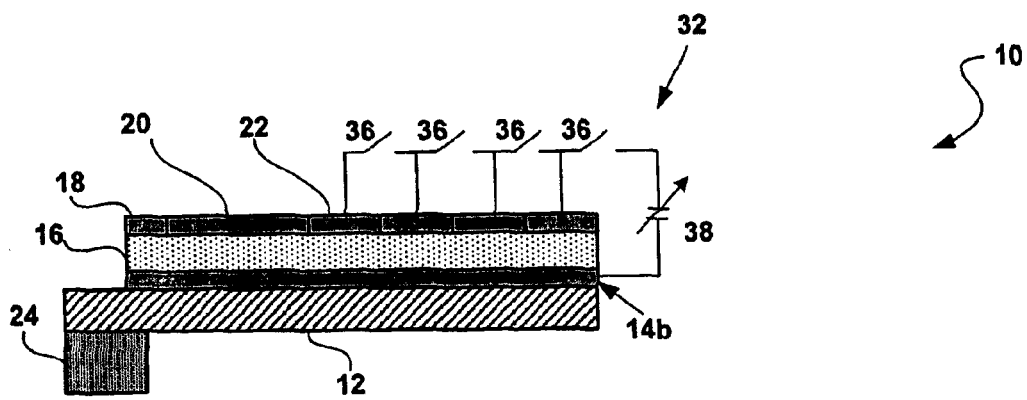
FIG. 9 is a schematic view illustrating a tuning circuit for the piezoelectric micro-mechanical resonator illustrated in FIG. 5 according to one embodiment of the present invention.

FIG. 9 is a schematic view illustrating a tuning circuit 32 for the piezoelectric micro-mechanical resonator 10 illustrated in FIG. 5 according to one embodiment of the present invention. As discussed in conjunction with FIG. 5, each segmented portion of the passive element can be independently shunted, thus allowing the elimination of the capacitors shown in FIG. 7. As illustrated in FIG. 9, each segmented portion of the passive element is connected to a switch 36 via a segmented passive electrode 22. A variable tuning capacitor (such as a varactor) 38, can be connected to and disconnected from each portion of the segmented passive electrode 22 to enable additional continuous tuning with this embodiment. It should be noted that if the varactor is replaced by a short circuit, then the system in FIG. 9 behaves similar to that in FIG. 7, but without the capacitors. The resonant frequency of the piezoelectric micro-mechanical resonator 10 can thus be tuned by controlling both the number of segmented portions of the passive element that are shunted and the amount of capacitance which shunts each segmented portion.

It should be noted that the shunt capacitance can be varied continuously using the varactor 38 and/or in very small steps using the switched capacitors 34 to tune the frequency of resonator 10. The frequency can be changed in finite steps (frequency hopping) by changing the switch 34 settings and by making discrete adjustments to the varactor 38.

It should be noted that the tuning circuits 32 illustrated in the embodiments of FIGS. 7–9 are for illustrative purposes only and are not intended to limit the present invention to these specific embodiments. It should be apparent to one skilled in the art that other circuits and components may be used while remaining within the scope of the present invention.

Figure 10A:
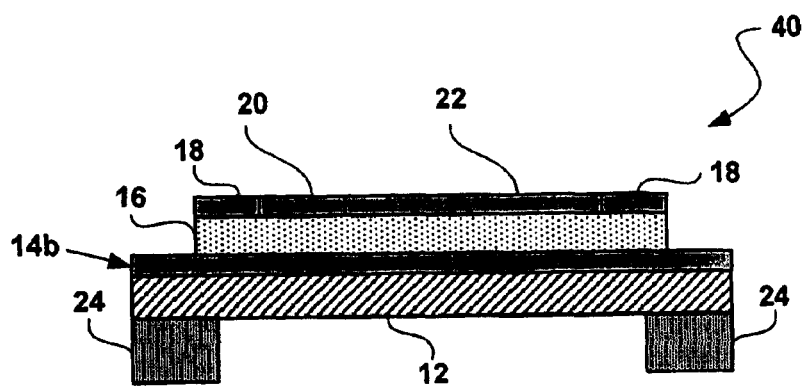
FIGS. 10(a)–10(d) illustrate piezoelectric micro-mechanical resonators according to alternative embodiments of the present invention.
Figure 10B:
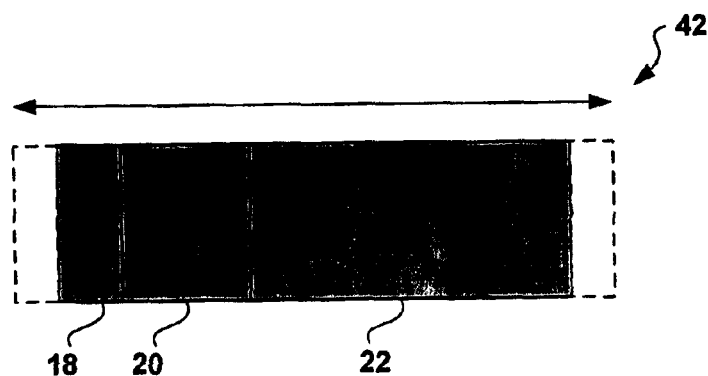
Figure 10C:
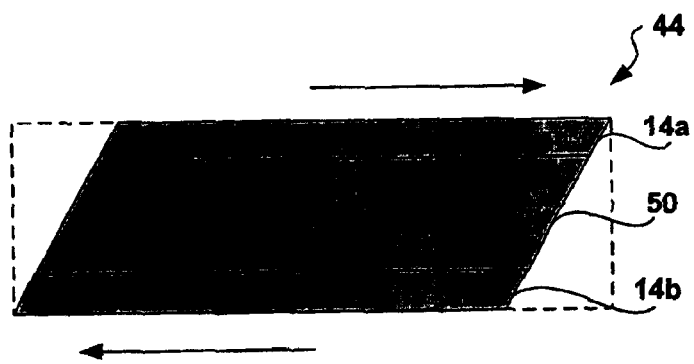
Figure 10D:
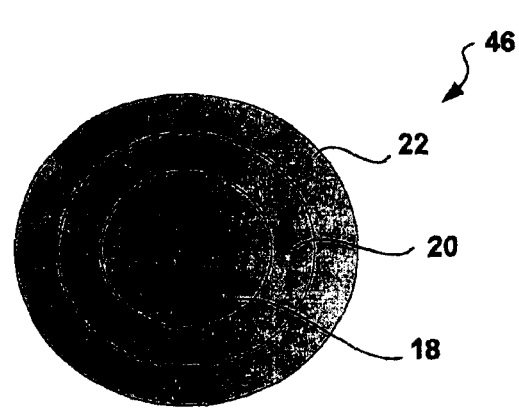

As briefly discussed above, FIGS. 10(a)–10(d) illustrate piezoelectric micro-mechanical resonators according to alternative embodiments of the present invention. FIG. 10(a) illustrates a clamped—clamped beam piezoelectric resonator 40. The cantilevered beam arrangement shown in FIGS. 1 and 5, and the clamped—clamped beam shown in FIG. 10(a), are beams that vibrate in bending. The clamped—clamped beam shown in FIG. 10(a) offers vibration modes that are not possible with the cantilevered beam shown in FIGS. 1 and 5. FIG. 10(b) illustrates an axial rod (or beam) resonator 42 that vibrates longitudinally (i.e., along its length). FIG. 10(c) illustrates a shear layer piezoelectric resonator 44 which vibrates in shear mode, meaning that there is an angular deformation of the material. The shear layer piezoelectric resonator 44 includes electrodes 14a, 14b and a piezoelectric shear layer with an embedded passive element 50. FIG. 10(d) illustrates a diaphragm piezoelectric resonator 46 which undergoes bending vibration similar to the beam (although the deflection is out-of-plane in the sketch shown).

One commonality among the resonators illustrated in FIGS. 1, 5, and 10(a)–10(d) is that each contains a passive element of piezoelectric material that is strained when the system vibrates. By controlling the electromechanical coupling of the passive element, the effective stiffness of the system is changed. The change in system's effective stiffness causes a change in the system's resonant frequency. In the current embodiment, the concept of capacitive shunting is used to alter the electromechanical coupling for controlling the resonant frequency in the micro-mechanical piezoelectric resonator 10. If the resonance is used as a frequency source for any of the applications as described above in the Background section, then the shunted capacitance provides a means of readily changing the frequency reference. It should be noted that other methods of changing the effective stiffness of the system to control the frequency reference may also be used while remaining within the scope of the present invention.

Figure 11A:
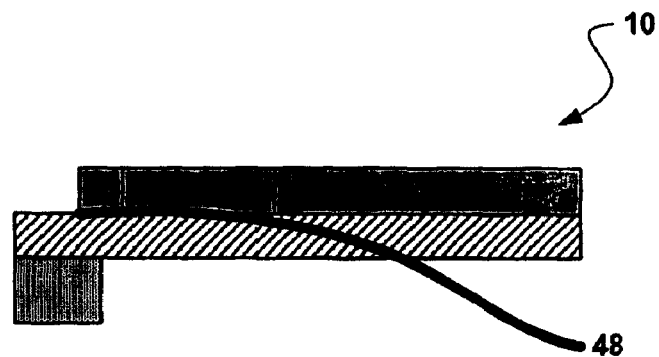
FIGS. 11(a)–11(c) illustrate bending modes of the piezoelectric micro-mechanical resonator of FIG. 1 according to one embodiment of the present invention.
Figure 11B:
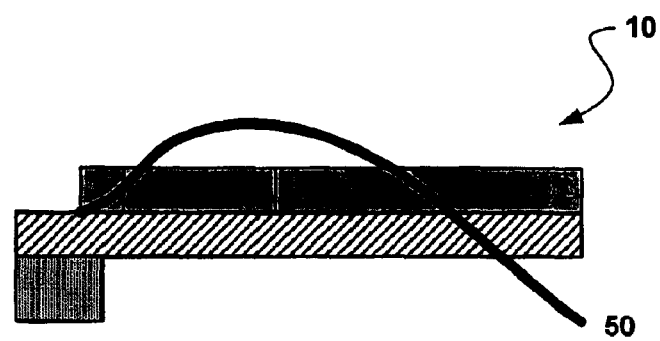
Figure 11C:
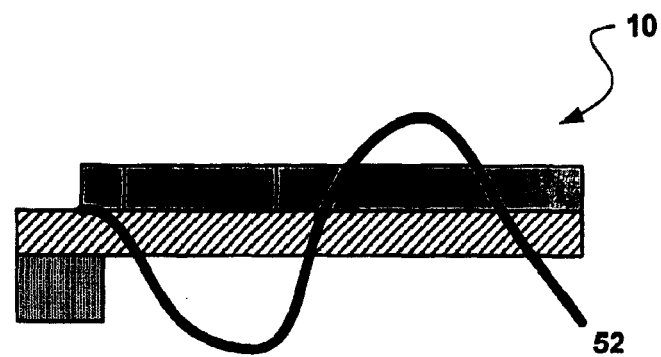

FIGS. 11(a)–11(c) illustrate bending modes of the piezoelectric micro-mechanical resonator 10 of FIG. 1 according to one embodiment of the present invention. Each embodiment of piezoelectric resonator previously described is known as a distributed parameter system, meaning that it actually has an infinite number of vibrating modes. The concept of infinite vibrating modes is illustrated in FIGS. 11(a)–11(c), which show the first three bending modes of a cantilevered beam (such as that shown in FIG. 1). For a given frequency, $\omega$, the vibrating composite member 26 creates a specific shape (for example for the first ($\omega_1$), second ($\omega_2$), and third ($\omega_3$) modes, the shape of the vibrating composite member 26 is illustrated by curves 48, 50, and 52 respectively). Note that higher modes (e.g., $\omega_2$ and $\omega_3$) in general have more complex bending patterns (i.e., more crossings of the equilibrium point), and also vibrate at higher frequencies.

As discussed above, depending on several factors, including the actuator element and sensor element geometries and locations on the structure, and the feedback loop's gain, phase and bandwidth, a resonator 10 can be made to oscillate at the frequency of any one of a large number of its different modes.

The frequency adjustment concept of this invention can be utilized with any resonator mode. The actual frequency adjustment range may vary from mode to mode on a given structure, and depends primarily on the geometry and location of the passive element with regard to the mode shape of interest. In general, the passive element should be placed in a region of high strain for a given mode. As illustrated in FIGS. 11(a)–11(b), modes $\omega_2$ and $\omega_3$ show higher strain than mode 1. Thus, higher tuning can be exhibited for the modes $\omega_2$ and $\omega_3$.

It should be recognized that the above-described embodiments of the invention are intended to be illustrative only. Numerous alternative embodiments may be devised by those skilled in the art without departing from the scope of the following claims.

What is claimed is:

1. A composite member for a resonator, comprising:
   an active piezoelectric element for causing said resonator to vibrate and for detecting a frequency of said vibration;
   a passive piezoelectric element operable to change said frequency of said vibration; and
   first and second electrodes, wherein said active piezoelectric element is defined by said first electrode and a portion of said second electrode and wherein said passive piezoelectric element is defined by said first electrode and another portion of said second electrode.

2. The composite member of claim 1 further comprising a substrate carrying said active piezoelectric element and said passive piezoelectric element.

3. The composite member of claim 1 wherein said active piezoelectric element further comprises:
   an actuator element for causing said resonator to vibrate; and
   a sensor element for detecting said frequency of said vibration.

4. The composite member of claim 3 wherein said second electrode is comprised of:
   an actuator electrode, wherein said actuator electrode and said first electrode define said actuator element;
   a sensor electrode wherein said sensor electrode and said first electrode define said sensor element; and
   a passive electrode wherein said passive electrode and said first electrode define said passive piezoelectric element.

5. The composite member of claim 4 wherein said passive electrode is segmented and wherein said segmented passive electrode and said first electrode define a segmented passive piezoelectric element.

6. A composite member for a resonator, comprising:
   an active piezoelectric element for causing said resonator to vibrate and for detecting a frequency of said vibration; and
   a passive piezoelectric element operable to change said frequency of said vibration, wherein said resonator further comprises an excitation circuit operable to provide a control signal to and receive a feedback signal from said active piezoelectric element and a tuning circuit operable to alter the electromechanical coupling of said passive piezoelectric element.

7. The composite member of claim 6 wherein said tuning circuit is operable to shunt a capacitance across said passive piezoelectric element.

8. The composite member of claim 6 further comprises:
   a switch; and
   a capacitance.

9. The composite member of claim 6 further comprises a varactor.

10. The composite member of claim 2 wherein said substrate is comprised of a non-piezoelectric material.

11. The composite member of claim 1 wherein said resonator is one of a clamped-unclamped cantilevered beam piezoelectric resonator, clamped-clamped cantilevered beam piezoelectric resonator, an axial rod piezoelectric resonator, a shear layer piezoelectric resonator, and a diaphragm piezoelectric resonator.

12. The composite member of claim 1 wherein said active piezoelectric element and said passive piezoelectric element are comprised of at least one of lead zirconate titanate, zinc oxide, lithium niobate, lithium tantalate, quartz, aluminum nitride, and polyvinylidine diflouride.

13. A piezoelectric resonator, comprising:
   a substrate;
   a first electrode carried by said substrate;
   a composite piezoelectric element carried by said first electrode, said composite piezoelectric element further comprising:
      an actuator element;
      a sensor element; and
      a passive element;
   a second electrode carried by said composite piezoelectric element;

an excitation circuit operable to supply a control signal to said actuator element and operable to receive a feedback signal from said sensor element; and a tuning circuit operable to alter the electromechanical coupling of said passive element.

14. The piezoelectric resonator of claim 13 wherein said substrate is comprised of a non-piezoelectric material.

15. The piezoelectric resonator of claim 13 wherein said second electrode is comprised of:

an actuator electrode wherein said actuator electrode and said first electrode define said actuator element;

a sensor electrode wherein said sensor electrode and said first electrode define said sensor element; and a passive electrode wherein said passive electrode and said first electrode define said sensor element.

16. The piezoelectric resonator of claim 15 wherein said passive electrode is segmented further defining a plurality of virtual segments in said passive element and wherein said tuning circuit is operable to alter the electromechanical coupling of each of said plurality of virtual segments.

17. The piezoelectric resonator of claim 16 wherein said tuning circuit is operable to shunt a capacitance across each of said plurality of virtual segments.

18. The piezoelectric resonator of claim 13 wherein said tuning circuit is operable to shunt a capacitance across said passive element.

19. The piezoelectric resonator of claim 13 wherein said actuator element is comprised of at least one of lead zirconate titanate, zinc oxide, lithium niobate, lithium tantalate, quartz, aluminum nitride, and polyvinylidine diflouride.

20. The piezoelectric resonator of claim 13 wherein said sensor element is comprised of at least one of lead zirconate titanate, zinc oxide, lithium niobate, lithium tantalate, quartz, aluminum nitride, and polyvinylidine diflouride.

21. The piezoelectric claim 13 wherein passive element is comprised of at least one of lead zirconate titanate, zinc oxide, lithium niobate, lithium tantalate, quartz, aluminum nitride, and polyvinylidine diflouride.

22. The piezoelectric resonator of claim 13 wherein said piezoelectric resonator is one of a clamped-unclamped cantilevered beam piezoelectric resonator, clamped-clamped cantilevered beam piezoelectric resonator, an axial rod piezoelectric resonator, a shear layer piezoelectric resonator, and a diaphragm piezoelectric resonator.

23. A tunable piezoelectric micro-mechanical resonator, comprising:

a composite member, said composite member being comprised of:
  a piezoelectric actuator element;
  a piezoelectric sensor element;
  a piezoelectric passive element; and
  a substrate carrying said piezoelectric actuator element, said piezoelectric sensor element, and said piezoelectric passive element;

an excitation circuit operable to induce a resonance at a frequency within said composite member and operable to receive a feedback signal from said composite member; and a tuning circuit connected to said piezoelectric passive element and operable to vary said frequency.

24. The tunable piezoelectric micro-mechanical resonator of claim 23 wherein said frequency is defined by $\omega_n = \sqrt{k/m}$ wherein k is the structural stiffness of said composite member and wherein m is the mass of said composite member.

25. The tunable piezoelectric micro-mechanical resonator of claim 24 wherein said tuning circuit is operable to change the structural stiffness of said composite member.

26. The tunable piezoelectric micro-mechanical resonator of claim 24 wherein said tuning circuit is operable to alter said mechanical frequency $\omega_n$ by altering the electromechanical coupling of said piezoelectric passive element.

27. The tunable piezoelectric micro-mechanical resonator of claim 23 wherein said turning circuit includes a variable capacitor.

28. The tunable piezoelectric micro-mechanical resonator of claim 23 wherein said tuning circuit includes a switch and a capacitor.

29. The tunable piezoelectric micro-mechanical resonator of claim 23 wherein said piezoelectric passive element includes a plurality of segments, each of said plurality of segments being individually controllable by said tuning circuit.

30. The tunable piezoelectric micro-mechanical resonator of claim 23 wherein said excitation circuit further comprises a feedback loop operable to supply a signal to said piezoelectric actuator element and operable to receive a signal from said piezoelectric sensor element.

31. The tunable piezoelectric micro-mechanical resonator of claim 23 wherein said piezoelectric actuator element and said piezoelectric sensor element are combined.

32. The tunable piezoelectric micro-mechanical resonator of claim 23 wherein said actuator element is defined by an actuator electrode and a first electrode, wherein said sensor element is defined by a sensor electrode and said first electrode, and wherein said passive element is defined by a passive electrode and said first electrode.

33. The tunable piezoelectric micro-mechanical resonator of claim 23 wherein said actuator element is defined by an actuator electrode and a first electrode, wherein said sensor element is defined by a sensor electrode and a second electrode, and wherein said passive element is defined by a passive electrode and a third electrode.

34. The tunable piezoelectric micro-mechanical resonator of claim 23 wherein said actuator, sensor, and passive elements are comprised of at least one of lead zirconate titanate, zinc oxide, lithium niobate, lithium tantalate, quartz, aluminum nitride, and polyvinylidine diflouride.

35. The tunable piezoelectric micro-mechanical resonator of claim 23 wherein said piezoelectric resonator is one of a clamped-unclamped cantilevered beam piezoelectric resonator, clamped-clamped cantilevered beam piezoelectric resonator, an axial rod piezoelectric resonator, a shear layer piezoelectric resonator, and a diaphragm piezoelectric resonator.

36. A method for controlling a resonator having composite member, said composite member having a substrate carrying a composite piezoelectric element, wherein said composite piezoelectric element includes an actuator element, a sensor element and a passive element, the method comprising:

inducing a resonance within said composite member with said actuator element;

detecting said resonance with said sensor element; and dynamically altering said resonance by altering the electromechanical coupling of said passive element.

37. The method of claim 36 wherein said altering said resonance by altering the electromechanical coupling comprises shunting a capacitance across said passive element.

38. The method of claim 36 wherein said altering said resonance by altering the electromechanical coupling comprises adjusting the stiffness of said composite member.

39. The method of claim 36 wherein said altering said resonance by altering the electromechanical coupling comprises tuning the resonance of said composite member.

40. The method of claim 36 wherein said altering said resonance by altering the electromechanical coupling comprises hopping from a first resonance to a second resonance.

41. A method for tuning a resonator operating at one of a plurality of frequency modes, said resonator being comprised of a composite member having a substrate carrying a piezoelectric element, said piezoelectric element including an actuator element, a sensor element and a passive element, the method comprising:

inducing a vibration at a single frequency within said composite member with said actuator element;

detecting said frequency with said sensor element; and dynamically adjusting said frequency with said passive element.

42. The method of claim 41 further comprises altering the electromechanical coupling of said passive element.

43. The method of claim 41 further comprises shunting a capacitance across said passive element.

44. The method of claim 41 further comprises measuring an electrical signal produced when said sensor element is placed under a mechanical strain.

45. The composite member of claim 6 further comprising a substrate carrying said active piezoelectric element and said passive piezoelectric element.

46. The composite member of claim 6 wherein said active piezoelectric element further comprises:

an actuator element for causing said resonator to vibrate; and a sensor element for detecting said frequency of said vibration.

47. The composite member of claim 46 wherein said second electrode is comprised of:

an actuator electrode, wherein said actuator electrode and said first electrode define said actuator element;

a sensor electrode wherein said sensor electrode and said first electrode define said sensor element; and a passive electrode wherein said passive electrode and said first electrode define said passive piezoelectric element.

48. The composite member of claim 47 wherein said passive electrode is segmented and wherein said segmented passive electrode and said first electrode define a segmented passive piezoelectric element.

49. The composite member of claim 6 wherein said substrate is comprised of a non-piezoelectric material.

50. The composite member of claim 6 wherein said resonator is one of a clamped-unclamped cantilevered beam piezoelectric resonator, clamped-clamped cantilevered beam piezoelectric resonator, an axial rod piezoelectric resonator, a shear layer piezoelectric resonator, and a diaphragm piezoelectric resonator.

51. The composite member of claim 6 wherein said active piezoelectric element and said passive piezoelectric element are comprised of at least one of lead zirconate titanate, zinc oxide, lithium niobate, lithium tantalate, quartz, aluminum nitride, and polyvinylidine diflouride.

\* \* \* \* \*

UNITED STATES PATENT AND TRADEMARK OFFICE
CERTIFICATE OF CORRECTION

PATENT NO. : 6,943,484 B2  Page 1 of 1
APPLICATION NO. : 10/313874
DATED : September 13, 2005
INVENTOR(S) : Clark et al.

It is certified that error appears in the above-identified patent and that said Letters Patent is hereby corrected as shown below:

In the text correct the following:
Column 7
　　line 33, delete ")$^{-1}$".
　　line 54, delete "$C_{shunt}=0 \rightarrow c_{electromechanical}=0$," and insert therefore --$C_{shunt}= 0 => c_{electromechanical} = 0$,--.
　　line 60, delete "⇨" and insert therefore --=>--.
In the Claims correct the following:
Column 10
　　claim 8, line 40, after "claim 6" insert --wherein said tuning circuit --.
　　claim 9, line 43, after "claim 6" insert --wherein said tuning circuit --.
Column 11
　　claim 24, line 60, after "k/m" insert--,--.
Column 13
　　claim 42, line 12, after "claim 41" insert --wherein said adjusting said frequency"--.
　　claim 43, line 14, after "claim 41" insert --wherein said adjusting said frequency"--.
　　claim 44, line 16, after "claim 41" insert --wherein said detecting said frequency"--.

Signed and Sealed this

First Day of August, 2006

JON W. DUDAS
*Director of the United States Patent and Trademark Office*